United States Patent [19]

Nablo

[11] Patent Number: 4,537,811
[45] Date of Patent: Aug. 27, 1985

[54] ELECTRON BEAM IRRADIATING PROCESS FOR RENDERING ROUGH OR TOPOGRAPHICALLY IRREGULAR SURFACE SUBSTRATES SMOOTH; AND COATED SUBSTRATES PRODUCED THEREBY

[75] Inventor: Sam V. Nablo, Lexington, Mass.

[73] Assignee: Energy Sciences, Inc., Bedford, Mass.

[21] Appl. No.: 899,493

[22] Filed: Apr. 24, 1978

[51] Int. Cl.³ ............................................. B05D 3/06
[52] U.S. Cl. ..................................... 428/166; 427/44; 427/411; 428/171; 428/308.8; 428/319.3
[58] Field of Search ................ 428/34, 318, 305, 166, 428/171, 308.8, 319.3; 427/44, 156, 279, 288, 411; 96/35, 35.1; 101/154, 170

[56] References Cited

U.S. PATENT DOCUMENTS

| | | | |
|---|---|---|---|
| 3,463,659 | 8/1969 | Dragoon et al. | 427/411 X |
| 3,770,486 | 11/1973 | Hoarmann | 427/411 X |
| 3,911,170 | 10/1975 | Honjo et al. | 427/411 X |
| 3,935,364 | 1/1976 | Proksch et al. | 427/44 X |
| 4,057,657 | 11/1977 | Garnett et al. | 427/44 |
| 4,092,173 | 5/1978 | Novak et al. | 427/44 X |

FOREIGN PATENT DOCUMENTS

| | | | |
|---|---|---|---|
| 47-28117 | 7/1972 | Japan | 427/44 |
| 49-31033 | 8/1974 | Japan | 427/44 |

Primary Examiner—John H. Newsome
Attorney, Agent, or Firm—Rines and Rines, Shapiro and Shapiro

[57] ABSTRACT

This disclosure involves a novel process for instantaneous electron-beam curing of very thin low viscosity, solventless coatings upon rough, irregular or textured surfaces of a substrate, such as paper or the like, that, through rather critical timing and energy adjustment procedures, causes the coating firmly to adhere to the surface before the coating can conform to the roughness or texture contour, and thereby providing a solidified very smooth outer surface for the substrate that is particularly useful for metalization and other finished layerings.

50 Claims, 1 Drawing Figure

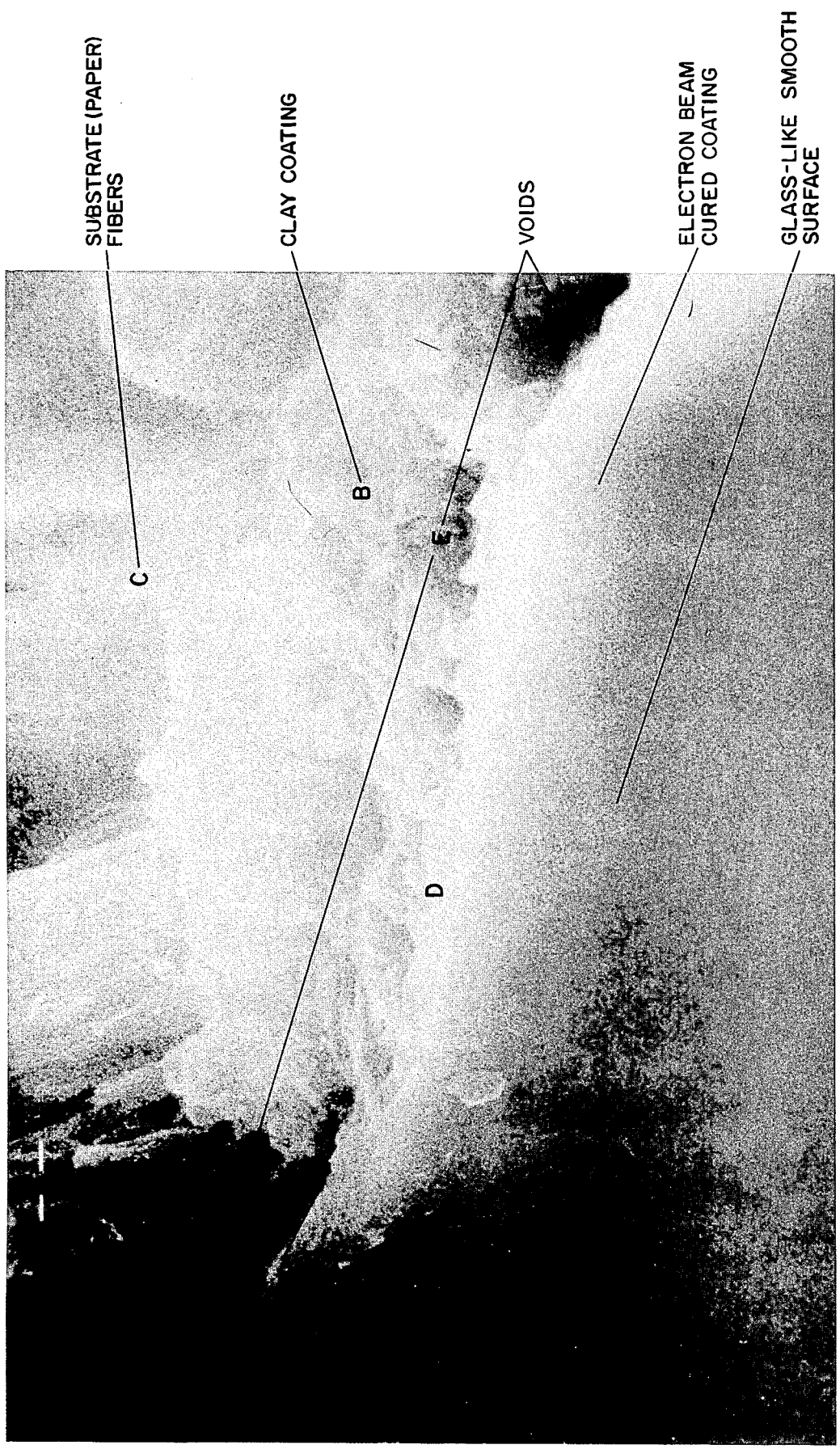

ELECTRON BEAM IRRADIATING PROCESS FOR RENDERING ROUGH OR TOPOGRAPHICALLY IRREGULAR SURFACE SUBSTRATES SMOOTH; AND COATED SUBSTRATES PRODUCED THEREBY

The present invention relates to processes for coating rough, topographically irregular or otherwise textured substrates to render them extremely smooth and to enable, where desired, the application thereto of further layers requiring smooth deposition surfaces. The invention also embraces the resulting smooth-coated substrate products that are produced by such processes. From an important aspect, the invention is more particularly, though not exclusively, directed to (1) coating paper and similar cellulosic and related substrates of a wide range of absorbency and porosity, including non-woven fabrics and the like, wherein the providing of metalized or other layers is presently rendered difficult in view of the rough or irregular and/or porous nature of the substrate surface; and (2) coating polymer films or paper wherein the surface roughness or dimensional instability of these substrates precludes their use for the intended application of the coated product.

Heretofore, the preparation of such substrates has required several applications of a thermally cured solvent-based coating to provide surfaces of suitable uniformity; or one has had to resort to blown films or the like to provide suitable substrates. The conventional approach to the coating of porous (or non-porous) surfaces for protective and decorative applications has involved curing of the solvent-based coating by the application of heat to both coating and substrate—the temperature elevation of the coating-substrate system leading to the volatilization of the solvent and the condensation-polymerization or curing of the remaining organic material (e.g. in a latex or alkyd paint, water is evolved and the remaining latex system is cured into a durable coating). Implicit in this process is:

(a) the heating and hence initial viscosity reduction of the coating;
(b) evolution of the solvent from the coating-substrate system;
(c) an extended period for curing ranging from seconds to hours; and
(d) delivery of heat energy to the substrate and hence an increase in its wettability.

All of these factors result in significant penetration of the coating into the substrate and lead to distortion, both on a microscopic and macroscopic scale, of the coating surface. The result is that a large quantity of coating is necessary to build-up a surface of "controlled" properties on both porous and non-porous substrates, and large quantities of thermal energy must be delivered to effect a cure. The latter effect is cellulosics or materials with a significant moisture content, such as natural fibers, is dimensional distortion of the substrate during the curing process. This has rendered such coated substrates unsuited to further layering that requires a high degree of surface and dimensional uniformity and stability.

Conventional clay coatings, as used in the paper industry, for example, have proven entirely inadequate for these applications; and because of their intrinsic porosity and roughness, the use of solvent-based coatings upon these clay coatings, does not provide substrates of the desired uniformity. Prior to the present invention, for example, there has not existed a metalized paper in which very thin aluminum or other materials have been susceptible to successful vapor deposition upon paper sheets, as an inexpensive substitution for foil paper laminates.

In accordance with the present invention and the discovery underlying the same, however, it has been found surprisingly feasible to apply an electron beam-curable, very thin, relatively low viscosity, solid (solvent-less) coating (such as vinyl, acrylate and other known coating materials of this nature) to such rough-surfaced substrates, including paper. Through a novel timing and energy adjustment procedure, moreover, the rough-surfaced paper or other substrate is rendered extremely smooth, (indeed, glass-like), with a firmly adhered electron beam-cured coating that has been rigidly fixed before it has had any opportunity for at least its outer surface to relax and conform to the roughened, irregular or textured surface of the substrate. The preferred process underlying the invention, moreover, enables minimum quantities of coating to be used for effectively smoothing the surface of the substrate, adapting it for use as a glass-like surface, or for subsequent treatment such as metalization or other filming or finishing. The rather critical relative timing of application and curing of the coating(s) is adjusted so that preferably even the bottom surface of the coating adjacent to the substrate, at the time it is cured, has not substantially deformed or relaxed strictly to follow the contour of the roughened or textured surface of the substrate; but, to the contrary, becomes adhered often with voids between the coating and substrate that not only aid in thermal isolation of the upper surface of the substrate, but further isolate the coating from physical deformation of the substrate, which may occur due to heating, or moisture loss or regain, or similar phenomena. The invention thus provides a process for the application and electron curing of thin coatings upon porous media (such as paper) with controlled penetration of the substrate and with controlled surface smoothness based mainly on the ability of the electron curing rapidly to cause the coatings to solidify.

The principal object of the invention, accordingly, is to provide a new and improved process for thus providing very smooth thin coatings to rough or textured substrates and the like, and to novel coated substrates produced by such a process.

A further object is to provide a novel process for providing otherwise rough-surfaced substrates, such as paper, with an adhered very smooth coated surface particularly adapted for metalization, and to provide a novel smooth paper and/or metalized paper produced by such process.

Still another object is to provide a process that enables control of the coating penetration of the substrate and controlled surface smoothness.

Other and further objects will be explained hereinafter and are more particularly delineated in the appended claims.

Since the type of apparatus used for coating, curing and, where used, vapor-deposition or other metalization or other final surfacing is now well-known, and the invention resides in the critical dimensioning, timing and parameters underlying the process, it is not believed necessary to illustrate the forming apparatus.

The accompanying FIGURE illustrates a micrograph of a section of a coated substrate produced in accordance with the invention.

Turning, first, to the application of the invention concerned with providing a paper surface with an extremely smooth coating, consider, for example, a 12 pound per ream clay-coated paper which has been found to have roughened surface discontinuities of the order of 3-5 microns. This texture renders such paper unsuited for the deposition of metal or other finishing layers. In accordance with the invention, a very thin coating (as, for example, of Mobil 414A low viscosity vinyl coating) is applied to the paper by the offset gravure process, with the additional use of a smoothing roll immediately after application, the coated paper being fed directly to the electron beam radiation zone, preferably containing a low-energy electron beam line or curtain apparatus of the type described in U.S. Pat. Nos. 3,702,412, 3,745,396 and 3,769,600.

With the distance of travel between the point of coating application and the electron curing zone adjusted to about 1.5 meters, and a paper web speed of the order of 150 meters per minute, a limited dwell time of the coating prior to its being set by the electron curing process is restricted to the order of only about 600 milliseconds (ms). With such timing and positioning, and the use of the curtain or line of electron radiation adjusted to provide of the order of 2 megarads uniformly within a process zone width of about 5 cm, as produced by about 150 keV of electron beam energy, an instantaneous cure of the coating is accomplished before at least the outer layers of the same can relax sufficiently to conform to the roughened discontinuities in the surface texture of the paper. This provides adequate engaging adhesion to the paper substrate with minimum penetration and provides a glass-like smooth external coating for the paper substrate. Even a scanning electron microphotographic analysis of 50,000 magnification of this coating did not reveal any surface structure greater than 1/10 of a micron. This was found to render the paper adaptable for conventional vapor deposition of aluminum or other metal, providing a highly reflective surface and other preferred barrier properties with minimal metal deposition, of the order of 250 A° or 0.025 microns. With a paper thickness of the order of 125 microns and a resulting smooth coating of thickness of the order of 5 microns, the electron beam curing enabled not only adequate penetration of the coating, but became absorbed partly within the thickness of the paper substrate, and without varying the moisture content, temperature or dimensional or chemical stability of the substrate. As before explained, beneficial voids or openings between the clay and coating have been verified by microphotographic analysis.

In the event that a smooth surface is all that is desired, of course, the metalized or further finishing layer need not be employed. It will further be observed that with the critical adjustments of the invention, only a single pass is necessary, as distinguished from other laminating or coating techniques employing the thermal curing of solvent-based systems. The ability to provide a fault-free surface on such textured substrates, as previously described, provides a direct base for the further deposition of barrier coatings which require such a smooth base; such as pvdc, "Saran", or a similar plastic or metalized layer, in order to provide, for example, water vapor and gas-impermeable barrier properties for applications such as food packaging, pharmaceuticals, as well as for aspectic applications and with a minimum use of the material used as the barrier film.

In the preferred uses of the invention, coatings of viscosities ranging from about 200 to 2000 centipoise (cp) may be employed with dwell times between coating application and electron curing of less than a second (say, from about 50 to 600 ms), and with electron-beam voltages adjusted from about 150 to 250 keV for thin coatings of the order from about 1 micron to 25 microns. The largest advantage, of course, is in the use of coatings of the order of one to a few microns since this represents a minimum of material and minimum costs for the product.

Systems successfully tested in accordance with the invention, employed electron-beam curing periods of 0.3-1+ seconds after application of the coating to the porous substrate, using electron energies of the said 150-250 keV, instantaneously to cure pigmented or clear low viscosity 100% solid coatings in the thickness range from 1 to 250 gm/m$^2$ uniformly in depth, and in lateral extent as well, as a result of the curtain or line irradiation geometry.

The substrate product, such as paper, organic or inorganic films or foil, can be unwound from a roll and coated at a conventional station consisting of a coating reservoir, and engraved gravure cylinder, and offset and back-up rolls for the thin application of non-viscous coatings to the substrates. The coated substrate then passes promptly from the coating station to the electron processor, designed to provide a controlled inerted environment for the curing of free radical-initiated coatings in the electron processor head as disclosed, for example, in said Letters Patent. After passing through the electron curing station, the web may then be rewound. Such a system is capable of operation up to speeds of the order of 1000 fpm, and can be used so as to provide the desired electron treatment level (or dose) of the coating at the selected web speed, with a preselected curing dose maintained automatically at any application speed up to the power handling limits of the electron processor.

In particular, at line speeds of interest for many industrial applications, (of the order of 500 feet/minute), the coating dwell time on the substrate is made very short between application and the electron-beam setting of the coating. With a coating station-to-electron processor station distance of the order of about 5 feet, the dwell time is of the order of 0.6 seconds before the coating is affected by the electron beam. The term "setting" is used to distinguish between the condition under which the coating will flow, and the condition where it has gelled. In the former case, viscosities of the order of the previously cited 1500 centipoises are typical for this work (as in the case of paper coatings); while in the latter case, immediately after irradiation, viscosities of a million centipoises are typical, with the radiation-initiated addition polymerization proceeding to full cure in a matter of seconds due to the continued activity of the long-lived radicals in the coating-substrate system.

Coatings in the range of 500-5000 centipoise have been successfully used with the offset gravure process, with little flow-out of the coating occurring before curing. The application cylinder engraving is preserved by the cured coating with good fidelity under these conditions, due to the absence of flow-out. A smoothing bar is thus used, following the coating station, as before explained, if a flat surface is required of the coating. For the examples of coated paper described herein, a gravure cylinder of 150 cells per inch was used, each cell being 62.5μ deep, under which conditions a coating thickness of only a few pounds per ream (3 gm/m$^2$) was required, using 100% solids coatings of low viscosity (e.g. 1500 cp). Since the cost of most coating and converting processes is dominated by the cost of the coating, it is desirable to minimize the quantity of coating used to achieve the desired finish. The combination of the 100% reactive coating (solventless) and the instantaneous cure provided by the electron processor, coupled with the minimum penetration of the substrate by the coating when applied at the appropriate viscosity and at room temperature, thus offers a process for achieving maximum coverage with minimum coating expenditure.

The scanning electron micrograph shown in the drawing, relates to a sample of 16 lb/ream clay-coated stock paper coated with Celanese RR0137 coating material as above-described. This view, at 25° and 3000 power, reveals the rear surface or substrate detail against the coating, so-labelled, which runs diagonally along the figure. The externally smooth coating is about 2-3μ thick (indicated at A), and the rough interface with the clay coating B does not show any signs of penetration into the clay coating itself. The electron-cured coating appears to be resting securely on the porous (paper) substrate, much as in the manner of a cast film, which has been unable to penetrate or permeate into the interstices or inhomogeneities of the substrate surface. The large rough fibers C of the paper itself are seen on the right-hand side of the micrograph. The rear surface (right-hand) of the coating only follows grossly the topography of the substrate as at region D, while maintaining a smooth front surface (left-hand). Well-defined voids E, of from several to tens of microns, are visible in the upper central interface area between the rear surface of the coating and the paper clay coating. If a barrier film is to be deposited upon the shown external glass-like smooth surface of the coating, as before described, the coated substrate may be fed to a station for lamination application of, for example, a gas-impermeable plastic sheet, or to a vacuum metalizing deposition station (say, aluminum).

A similar series of micrographs was taken on similar samples, coated with Mobil 414A, applied at 500 fpm with the 150 quad gravure cylinder and smoothing bar, showing similar structures.

As another example of the flexibility of the invention to cure a wetted surface before coating relaxation occurs, flock adhesive was successfully applied to a vinyl-coated fabric and nylon flock fibers in accordance with the above-described process. Other applications of the invention can be in areas requiring very thin smooth films or coatings as in release paper manufacture, transfer casting of coatings and in the manufacture of photographic films. If desired, moreover, further to assist in laying flat the electron-beam-curable coating, a thin aluminum foil or other smoothing skin, permeable to the electron beam, may be layed down upon the applied coating with the coating then cured through the skin, and with the skin subsequently peeled away. Further modifications will also occur to those skilled in this art, and such are considered to fall within the spirit and scope of the invention as defined in the appended claims.

With the preferred low energy electron generator system described in said Letters Patent, furthermore, it is possible to control the depth of penetration of the curing energy over the range of 1-250 gm/m$^2$ of treated thickness. It will also be obvious to those skilled in the art that higher energy electron beam machines of either the scanned, unscanned or pulsed type may be used for these purposes, or that scanned or pulsed processors of equivalent energy may be so used, though not with as efficient coverage operation as the preferred curtain-type generators.

In summary, advantages attainable with the invention include the use of high-speed curing of 100% solids coatings with electron processors, having output energies in the range from 150 keV to 250 keV, and delivering doses ranging from 0.25 to 5 megarads, at speeds from 10 to 300 meters/minute, to achieve defect-free coating surfaces not achievable with the thermal curing of coated substrates, or not achievable with relatively "slow" curing technology, such as microwave, ultraviolet, infrared, etc. For the process claimed herein, application-to-cure times are typically less than one second. The use of this process permits minimum coating thickness in the complete surface coverage of a porous substrate, as in the application of release, barrier, decorative or protective coatings; and the process accomplishes this by limiting the substrate infiltration or interface penetration by the coating through the near instantaneous change of state of the coating from a liquid to a solid by electron curing. The generation of a geometrically smooth surface results from this process after application of the coating to a smooth, rough or porous substrate of organic or inorganic matter. Applications of the process are numerous, including imbuing paper, film and like media with maximum smoothness, such as is required in the metalization coating of paper or other porous matter, and where maximum reflectivity or gloss of the cured coating is desired for the end product. The use of the process also enables the high-fidelity preservation of contours or images laid down on or in the coating while in its liquid state by the application of deforming or imaging energy by mechanical, electrical, sonic or magnetic techniques. The casting of free polymer films possessing defect-free surfaces of controlled topology is also achievable; and the process enables the generation of defect-free films for the manufacture of barrier coatings for packaging films and constructions, offering low gas and water vapor transmission. Through the use of low energy electrons of energies less than 200 keV, damage to the substrate is minimized, particularly for those applications of labile substrates, or on paper and textiles where moisture retention of the substrate during curing is desirable to provide maximum dimensional stability of the substrate. The use of the process with variable dwell times, ranging from 1 millisecond to 600 milliseconds, between coating applications and electron beam cure, lastly, enables control of the depth of penetration, infiltration and adhesions of the coating to the porous or non-uniform substrate.

What is claimed is:

1. A process for providing a substrate with an adhered coating of controlled penetration and predetermined external surface texture, that comprises, applying an electron-beam-curable, thin, low viscosity, solid coating to a surface of the substrate; subjecting the coated substrate to electron-beam energy after a dwell time following the applying of the coating adjusted to be sufficiently short to prevent the coating from relaxing into conformity with the substrate surface and from substantial penetration into the substrate, said dwell time being within the range of the order of one second down to fractions thereof; and adjusting the electron beam energy to sufficient value, dose, coverage and penetration thereupon rapidly to cure the coating uniformly throughout its thickness and extent in adhering engagement with the substrate, and with an external coating surface of controlled defect-free texture.

2. A process as claimed in claim 1 and in which the substrate is fed along a line from coating to applying the electron beam, and the electron-beam adjusting step is effected within a value range of about 150 to 250 keV with a dose range of about 0.25 to 5 megarads.

3. A process as claimed in claim 2 and in which the coating applying step is effected by offset gravure followed by smoothing of the coating.

4. A process as claimed in claim 2 and in which the said low viscosity is of the order of about several hundred to two thousand cp.

5. A process as claimed in claim 2 and in which the coating applying step is controlled to effect a coating of thickness of the order of microns.

6. A process as claimed in claim 5 and in which said thickness is controlled to lie within the range of from about 1–25 microns.

7. A process as claimed in claim 5 and in which the thinness of the coating and shortness of said dwell time are adjusted to produce an external defect-free coating surface of smooth, glass-like texture.

8. A process as claimed in claim 7 and in which a further surface requiring a smooth base is applied upon the said smooth, glass-like external coating surface.

9. A process as claimed in claim 8 and in which said further surface comprises a water vapor and gas barrier film.

10. A process as claimed in claim 9 and in which said barrier film comprises a gas-impermeable plastic layer.

11. A process as claimed in claim 10 and in which said barrier film comprises a metalized layer.

12. A process as claimed in claim 10 and in which said substrate is selected from the group consisting of paper, clay-coated paper, cellulosic surfaces, nonwoven and plastic fabrics, and polymer films.

13. A process as claimed in claim 2 and in which said substrate is of rough or porous surface texture, and said electron-beam-curable coating is adhered to the rough surface with the external cured coating surface being of glass-like smoothness.

14. A process as claimed in claim 13 and in which the dwell time and electron-beam adjusting are effected so as to adhere the coating to the substrate with voids therebetween.

15. A process as claimed in claim 13 and in which said substrate is of paper, and said coating is of electron-beam-curable plastic material cured into said external coating surface of glass-like smoothness.

16. A process as claimed in claim 15 and in which a gas-impermeable barrier film is applied upon said glass-like external coating surface.

17. A process as claimed in claim 16 and in which said barrier film is a metalizing layer.

18. A process as claimed in claim 17 and in which the metalizing layer is aluminum deposited by vacuum deposition.

19. A coated substrate product having, in combination, a substrate of relatively rough texture; a thin electron-beam-cured coating adhered to, but not substantially penetrating and contouring to the rough texture of the substrate; said coating having its external surface cured into glass-like smoothness and its inner surface separated with voids between portions of the substrate and the inner surface of the coating.

20. A coated substrate product as claimed in claim 19 and in which the substrate is selected from the group consisting of paper, clay-coated paper, cellulosic surfaces, nonwoven and plastic fabrics, and polymer films; and the thin coating is formed from a low viscosity, electron-beam-curable, solid, solventless material in a thickness of the order of microns.

21. A coated substrate product as claimed in claim 20 and in which a gas-impermeable barrier is applied to said glass-like external coating surface.

22. A coated substrate product as claimed in claim 21 and in which said barrier is selected from the group consisting of plastic sheet, plastic film and metalized layer.

23. A coated substrate product as claimed in claim 20 and in which the coating material is of electron-curable polymer material, as of vinyl and acrylate, of viscosity in the range between hundreds and two thousand cp.

24. A coated substrate product formed by the process of claim 1.

25. A process as claimed in claim 1 and in which an electron-permeable layer is applied to the coating to assist in laying the same flat, and said layer is removed after the electron-beam curing of the coating through said layer.

26. A process for providing a relatively rough substrate with an adhered coating of controlled penetration and predetermined relatively smooth external surface texture, that comprises, applying an electron-beam-curable, thin, low viscosity, solid coating carried by a thin layer, to a surface of the substrate; subjecting the coated substrate to electron-beam energy after a dwell time following the applying of the layer-carried coating adjusted to be sufficiently short to prevent the coating from conforming with the relatively rough substrate surface and from substantial penetration into the substrate, said dwell time being within the range of the order of one second down to fractions thereof; and adjusting the electron beam energy to sufficient value, dose, coverage and penetration thereupon rapidly to cure the coating uniformly throughout its thickness and extent in adhering equipment with the substrate, and with an external coating surface of controlled defect-free relatively smooth texture; and peeling off the said layer.

27. A process as claimed in claim 26 and in which said substrate is paper and the said coating on said thin layer has a thickness of the order of microns.

28. The process of metallizing paper comprising the steps of:
    coating a surface of a paper substrate with a solventless thin film consisting essentially of a radiation curable resin precursor;
    immediately contacting said film with electron radiation sufficient to cure said precursor before said precursor has penetrated into said paper substrate a distance sufficient to cause detrimental stiffening thereof; and
    metallizing the exposed surface of said film.

29. The process of claim 28 wherein said film is sufficient thick to cover substantially all fibrous paper material projecting from said surface.

30. The process of claim 29 wherein said film has a thickness after curing of from about 1 to about 25 microns.

31. The process of claim 30 wherein said film is cured before penetrating into said paper substrate more than a quarter of the thickness of said paper substrate.

32. The process of claim 31 wherein said film has imbedded therein from about 5% to about 25% of paper fibers.

33. The process of claim 32 wherein said resin precursor has a viscosity of from about 500 to about 5,000 centipoise.

34. The process of claim 33 wherein said viscosity is from about 2,000 to about 3,000 centipoise.

35. The process of claim 34 wherein said viscosity is from about 2,600 to about 2,700 centipoise.

36. The process of claim 33 wherein said metallizing step is carried out by a vacuum metallizing technique.

37. The process of claim 36 wherein said paper substrate is flexible and has a thickness of about 125 microns.

38. The process of claim 37 wherein said metallizing step provides a metal layer on said film which is less than 1/100th the thickness of said film.

39. The process of claim 38 wherein said metal is selected from the group consisting of aluminum and other metals.

40. The process of claim 39 wherein said metal is aluminum.

41. The process of applying a layer to a modified paper substrate comprising the steps of:
   coating a surface of a paper substrate with a thin film consisting essentially of a radiation curable resin precursor;
   immediately contacting said film with electron radiation sufficient to cure said precursor before said precursor has penetrated into said paper substrate a distance sufficient to cause detrimental stiffening thereof; and
   applying said layer on the exposed surface of said film.

42. The process of claim 41 wherein said film is sufficiently thick to cover substantially all fibrous paper material projecting from said surface.

43. The process of claim 42 wherein said film has a thickness after curing of from about 1 to about 25 microns.

44. The process of claim 43 wherein said film is cured before penetrating into said paper substrate more than a quarter of the thickness of said paper substrate.

45. The process of claim 44 wherein said film has imbedded therein from about 5% to about 25% of paper fibers.

46. The process of claim 45 wherein said resin precursor has a viscosity of from about 500 to about 5,000 centipoise.

47. The process of claim 46 wherein said viscosity is from about 2,000 to about 3,000 centipoise.

48. The process of claim 47 wherein said viscosity is from about 2,600 to about 2,700 centipoise.

49. The process of claim 46 wherein said applying step is carried out with material selected from the group consisting of plastic or metal.

50. The process of claim 49 wherein said paper substrate has a thickness of about 125 microns.

* * * * *